United States Patent
Nanda et al.

(10) Patent No.: US 7,247,556 B2
(45) Date of Patent: Jul. 24, 2007

(54) CONTROL OF WAFER WARPAGE DURING BACKEND PROCESSING

(75) Inventors: Arun K. Nanda, Singapore (SG); Nace Rossi, Singapore (SG)

(73) Assignee: Agere Systems Inc., Allentown, PA (US)

( * ) Notice: Subject to any disclaimer, the term of this patent is extended or adjusted under 35 U.S.C. 154(b) by 121 days.

(21) Appl. No.: 11/068,237

(22) Filed: Feb. 28, 2005

(65) Prior Publication Data

US 2006/0194428 A1   Aug. 31, 2006

(51) Int. Cl.
*H01L 21/4763* (2006.01)

(52) U.S. Cl. .............. 438/624; 438/636; 438/671; 257/758; 257/760; 257/773

(58) Field of Classification Search .......... 438/624, 438/636, 671; 257/758, 760, 773
See application file for complete search history.

(56) References Cited

U.S. PATENT DOCUMENTS 6,432,845 B1 *  8/2002  Morozumi ............... 438/789
6,867,129 B2 *  3/2005  Tu ............................ 438/636
7,008,869 B2 *  3/2006  Han .......................... 438/622
7,057,262 B2 *  6/2006  Goldstein ................ 257/635

OTHER PUBLICATIONS

"Silicon Nitride and Oxynitride Films," by F. H. P. M. Habraken and A. E. T. Kuiper, Mater. Sci. Eng. R12, No. 3, (1994) pp. 123-175.
"Characterization of PECVD Deposited Silicon Oxynitride Thin Films," by S. P. Speakman, et al, Vacuum, v. 38, No. 3, (1988) pp. 183-188.

* cited by examiner

*Primary Examiner*—Zandra V. Smith
*Assistant Examiner*—Christy Novacek

(57) ABSTRACT

A method of fabricating an integrated circuit (IC), during which wafer warpage is controlled by appropriately controlling intrinsic stresses in one or more service layers of the layer stack of the IC's multilevel interconnect structure. In one embodiment, each interconnect level of the multilevel interconnect structure has a dielectric layer, a conducting layer formed over the dielectric layer, and a service anti-reflective coating (ARC) layer formed over the conducting layer. Each ARC layer is formed from silicon oxynitride such that at least two ARC layers corresponding to different interconnect levels have different intrinsic stresses. The amount of intrinsic stress in each ARC layer is controlled, e.g., through the control of temperature and/or gas composition during the layer deposition.

11 Claims, 4 Drawing Sheets

CONTROL OF WAFER WARPAGE DURING BACKEND PROCESSING

BACKGROUND OF THE INVENTION

1. Field of the Invention

The present invention relates to fabrication of semiconductor integrated circuits and, more specifically, to methods for controlling properties of functional layers employed in the fabrication of interconnect structures.

2. Description of the Related Art

Individual circuit elements (e.g., transistors) of an integrated circuit (IC) are appropriately interconnected using an electrically conductive interconnect structure. The process of forming the interconnect structure is usually referred to as backend processing. During backend processing, stacks of conducting and dielectric layers are successively deposited over the semiconductor substrate, patterned, etched, and polished to form electrically conductive pathways between the circuit elements and interface terminals of the IC. The most common electrically conductive materials used in backend processing include aluminum, titanium, nickel, chromium, gold, copper, silver, tungsten, platinum, tantalum, and various alloys thereof, and the most common dielectric materials include silicon oxide, silicon nitride, silicon oxynitride, silicon carbide, metal oxides, metal nitrides, metal carbides, and various combinations/mixtures thereof.

Layer deposition is often accomplished at an elevated temperature with the most common deposition techniques being chemical vapor deposition (CVD), filament evaporation, electron-beam evaporation, flash evaporation, induction evaporation, sputtering, and spin-on coating. When the wafer temperature is subsequently changed, the deposited layers contract or expand in accordance with the values of their respective thermal expansion coefficients. However, because 1) layers adhere to one another and 2) layers exhibit differences in the thermal expansion coefficients, tensile and/or compressive stresses are generated within the layers when the wafer temperature changes. Non-uniform stresses across the layer stack result in stress gradients, which usually cause the wafer to warp (adapt a non-planar shape). Disadvantageously, wafer warpage might affect patterning, etching, and/or polishing of the wafer and might cause topologic defects (e.g., circuit breaks and/or shorts) within the interconnect structure, thereby detrimentally affecting the die yield.

SUMMARY OF THE INVENTION

Problems in the prior art are addressed, in accordance with the principles of the present invention, by a method of fabricating an integrated circuit (IC), during which wafer warpage is controlled by appropriately controlling intrinsic stresses in one or more service layers of the layer stack of the IC's multilevel interconnect structure. In one embodiment, each interconnect level of the multilevel interconnect structure has a dielectric layer, a conducting layer formed over the dielectric layer, and a service anti-reflective coating (ARC) layer formed over the conducting layer. Each ARC layer is formed from silicon oxynitride such that at least two ARC layers corresponding to different interconnect levels have different intrinsic stresses. The amount of intrinsic stress in each ARC layer is controlled, e.g., through the control of temperature and/or gas composition during the layer deposition. Advantageously, fabrication conditions for different ARC layers can be selected such that the wafer is relatively flat during and/or after the fabrication of one or more levels of the interconnect structure.

According to one embodiment, the present invention is a method of fabricating an integrated circuit, comprising forming on a wafer an interconnect structure having one or more interconnect levels, wherein forming each interconnect level comprises forming a dielectric layer, forming a conducting layer over said dielectric layer, and forming a service layer over said conducting layer, wherein: each service layer has one or more sub-layers; and at least two of said sub-layers in the interconnect structure have at least one of different compositions and different lattice mismatches with the corresponding one or more conducting layers.

According to another embodiment, the present invention is an integrated circuit, comprising an interconnect structure formed on a wafer and having one or more interconnect levels, wherein each interconnect level comprises a dielectric layer, a conducting layer formed over said dielectric layer, and a service layer formed over said conducting layer, wherein: each service layer has one or more sub-layers; and at least two of said sub-layers in the interconnect structure have at least one of different composition and different lattice mismatches with the corresponding one or more conducting layers.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
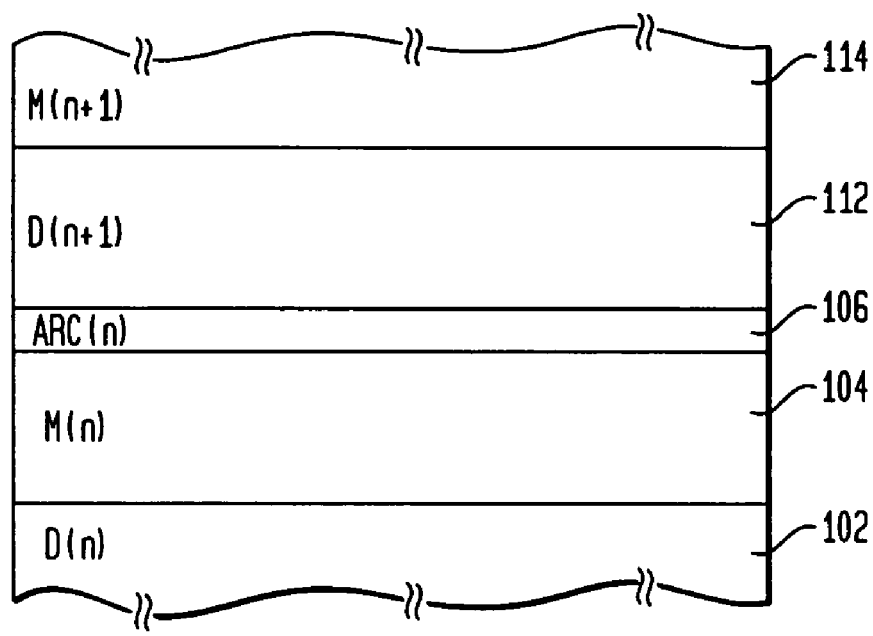
FIG. 1 shows a cross-sectional view of a portion of an integrated circuit (IC) having a multilevel interconnect structure.

FIG. 1 shows a cross-sectional view of a portion of an integrated circuit (IC) 100 having a multilevel interconnect structure. More specifically, FIG. 1 shows a portion of the interconnect structure having dielectric (D) layers 102 and 112, conducting (M) layers 104 and 114, and an anti-reflective coating (ARC) layer 106. In general, the interconnect structure of IC 100 includes a stack of layers having, for each interconnect level, a repeated kernel of layers D(n)+

M(n)+ARC(n), where n is the interconnect level index and $1 \leq n \leq N$. In a representative embodiment, the interconnect structure can be implemented with eight interconnect levels (i.e., N=8).

Each conducting layer M(n) typically includes a stack of sub-layers (not shown in FIG. 1). For example, in one embodiment, a conducting layer M(n) has five sub-layers arranged as follows: Ti/TiN/Al/Ti/TiN. In an alternative embodiment, a conducting layer M(n) may have more or fewer than five sub-layers. In addition, conducting layers M(n) corresponding to different interconnect levels may have the same or different sub-layer structure/composition.

Each dielectric layer D(n) may also include two or more sub-layers (not shown in FIG. 1), with the most typical configuration being a dielectric isolation-oxide sub-layer and a cap-oxide sub-layer. Some dielectric layers may have vias or openings to accommodate conductive plugs (not shown in FIG. 1), which electrically connect appropriate portions of adjacent conducting layers, e.g., layers M(n) and M(n+1).

An ARC layer is a service layer, which is deposited over a corresponding conducting layer to facilitate its lithographic patterning. More specifically, to have the conducting layer lithographically patterned, it is first covered by an ARC layer and then by a layer of photo-resist deposited over the ARC layer. The ARC layer serves to minimize possible deviations from the desired photo-resist exposure pattern caused, for example, by light scattering and reflections from the topographic features of the underlying layers, standing waves, and/or thin-film interference effects. While the photo-resist is stripped after the patterning step is complete, the corresponding ARC layer is often left to remain within the layer stack of the interconnect structure as shown in FIG. 1. In one embodiment, an ARC layer is formed using silicon oxynitride having a composition generally described by the following formula—$SiO_xN_y$.

Figure 2:
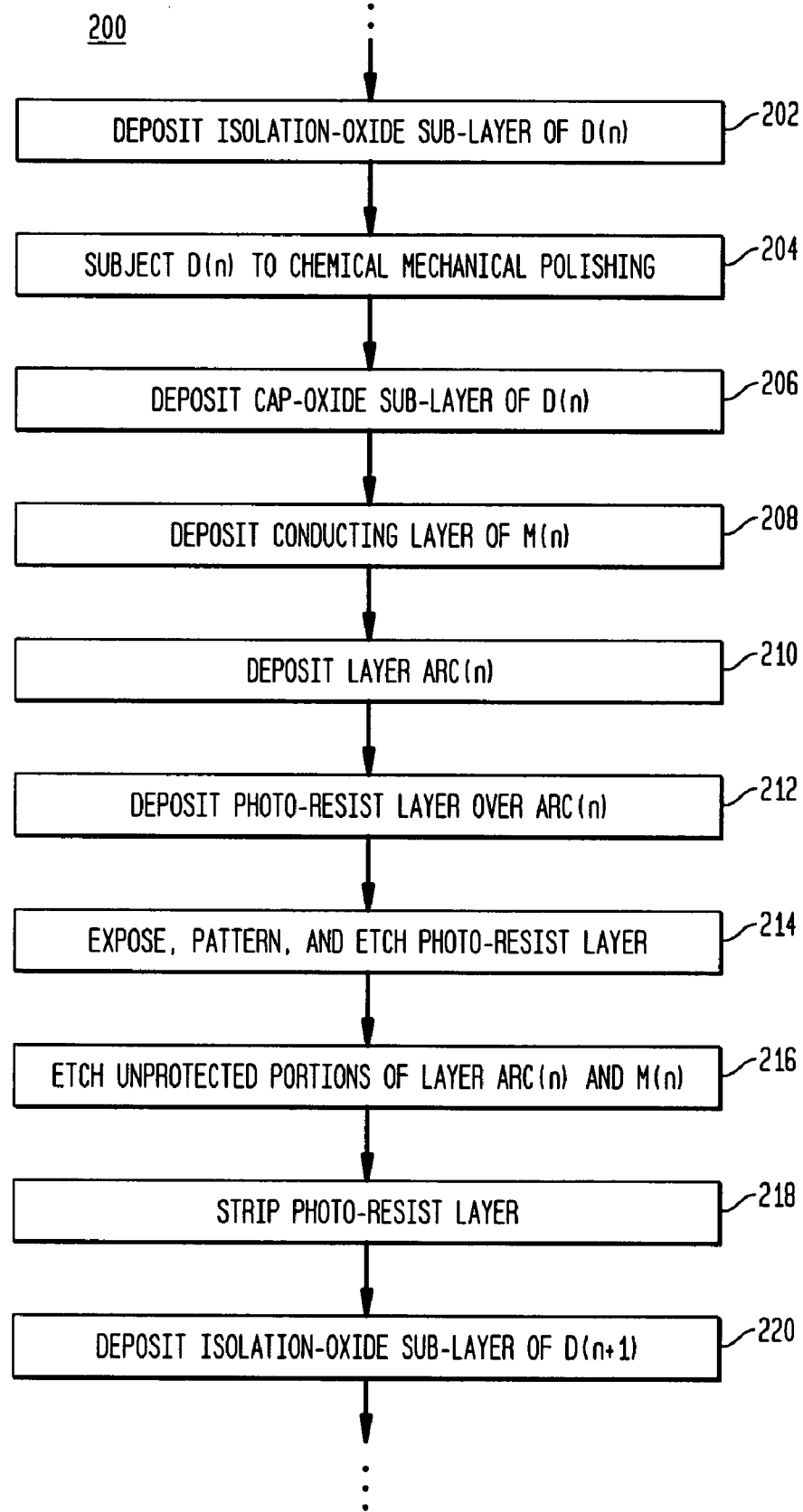
FIG. 2 shows a flow diagram of a representative fabrication process, which can be used to form the multilevel interconnect structure of the IC shown in FIG. 1.

FIG. 2 shows a flow diagram of a representative fabrication process 200, which can be used to form the multilevel interconnect structure of IC 100. At step 202, a dielectric isolation-oxide sub-layer of layer D(n) is deposited over the wafer. This sub-layer generally follows the present wafer topography and, as such, has ridges, depressions, and other features that make its surface non-flat. At step 204, the dielectric isolation-oxide sub-layer of layer D(n) is subjected to chemical mechanical polishing to make its surface substantially flat. At step 206, a cap-oxide sub-layer of layer D(n) is deposited over the polished isolation-oxide sub-layer to inhibit diffusion of F from the underlying (sub)layers into subsequently deposited overlaying (sub)layers. At step 208, conducting layer M(n) is deposited over the cap-oxide sub-layer of layer D(n). At step 210, layer ARC(n) is deposited over conducting layer M(n). At step 212, a photo-resist layer is deposited over layer ARC(n). At step 214, the photo-resist layer is exposed to UV irradiation through a lithographic mask to imprint a desired pattern. The pattern is then developed by etching away the (un)exposed portions of the photo-resist layer. At step 216, the developed pattern is transferred onto layers ARC(n) and M(n) by etching away the portions of these layers that are not protected by the remaining photo-resist. At step 218, the remaining photo-resist is stripped to expose the transferred pattern. Step 218 substantially completes the fabrication process of level (n) of the multi-level interconnect structure and, starting at step 220, a sequence of steps substantially analogous to steps 202-218 is repeated to fabricate level (n+1) of that structure.

Note that FIG. 2 is not intended to show an exhaustive set of fabrication steps. For example, the steps of photo-resist masking, window opening, barrier deposition, plug forming, and/or various lapping and polishing steps may be included in various embodiments of fabrication process 200 as necessary, without departing from the scope and principles of the invention. In addition, a fluorinated silicate glass (FSG) isolation-oxide sub-layer capped with a cap-oxide sub-layer is just one exemplary configuration for an inter-level dielectric layer. Other configurations, e.g., using undoped oxide and/or doped oxide, can similarly be used without departing from the scope and principles of the present invention.

Figure 3:
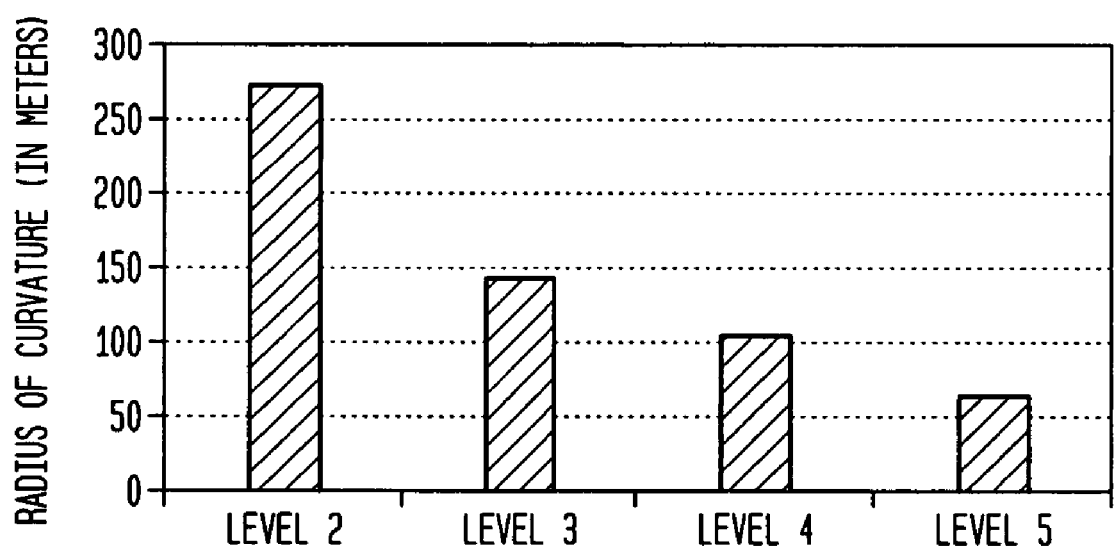
FIG. 3 graphically illustrates progressive deterioration in the wafer planarity when the method of FIG. 2 is implemented using conventional prior-art techniques.

FIG. 3 graphically illustrates progressive deterioration in the wafer planarity when method 200 is implemented using conventional prior-art techniques. More specifically, FIG. 3 shows changes in the curvature radius, with the measurements being taken for each interconnect level after the fabrication step corresponding to step 210 of FIG. 2, as the fabrication process progresses from the formation of interconnect level 2 to the formation of interconnect level 5. Note that the curvature radius can be considered a measure of the wafer warpage and an ideally flat wafer has an infinitely large curvature radius, while a wafer that is warped relatively strongly has a relatively small curvature radius. As shown in FIG. 3, the curvature radius decreases (the warpage increases) from about 270 meters at interconnect level 2 to about 60 meters at interconnect level 5.

Figure 4:
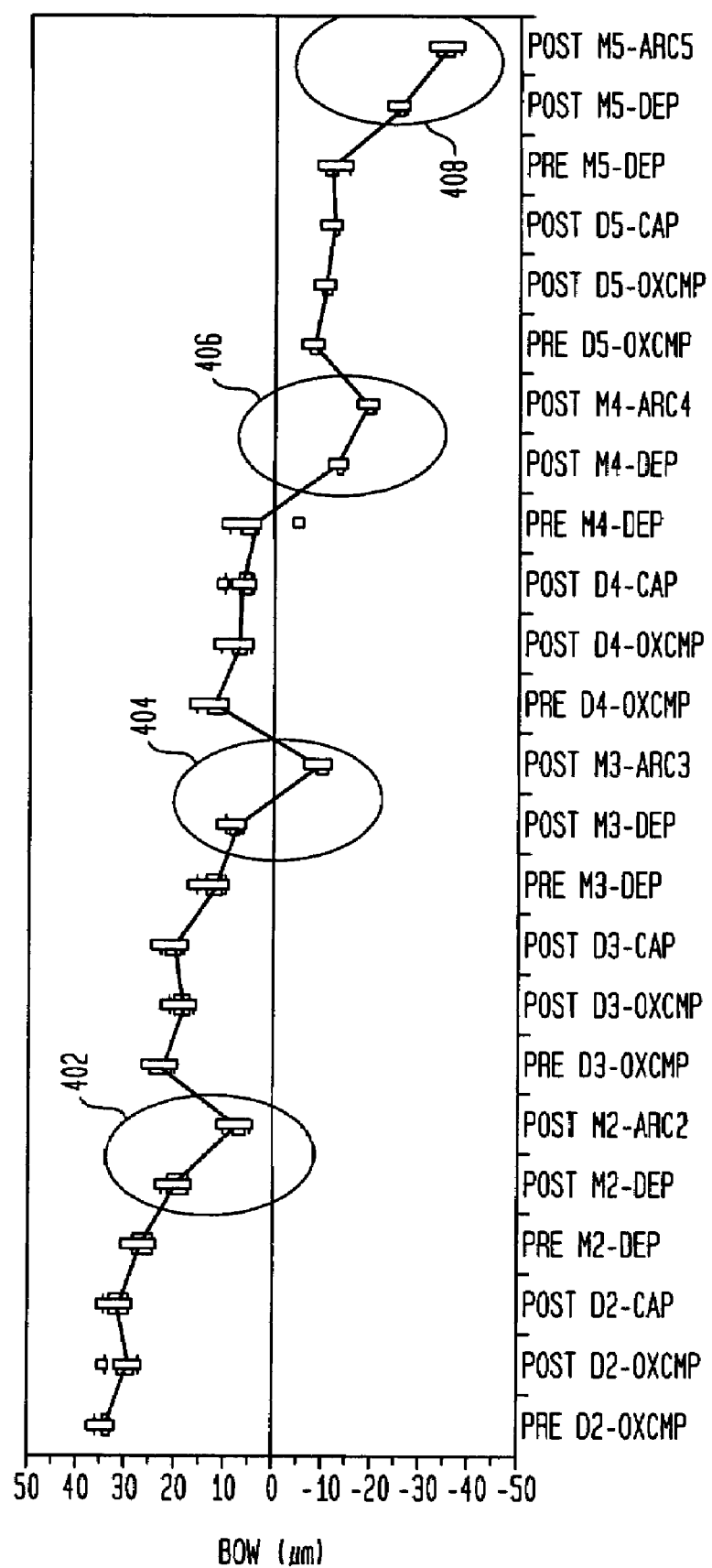
FIG. 4 graphically illustrates changes in the wafer planarity referenced to specific steps of the method of FIG. 2.

FIG. 4 graphically illustrates changes in the wafer planarity referenced to specific steps of method 200. Note that, in contrast to FIG. 3, which shows the wafer planarity in terms of the curvature radius (R), FIG. 4 shows the wafer planarity in terms of the bow (B) related to the curvature radius as follows:

$$B = \frac{d^2}{8R} \quad (1)$$

where d is a linear size (e.g., diameter) of the wafer. Negative and positive values of the bow correspond to the concave up and down shapes, respectively, and different symbols (squares) corresponding to the same fabrication step in FIG. 4 show bow measurements taken at different locations on the wafer. The following legend is used in FIG. 4 to reference the processing steps: OXCMP—chemical mechanical polishing of a dielectric isolation-oxide sub-layer (e.g., step 204 in FIG. 2); CAP—a cap-oxide sub-layer; DEP—deposition; PRE—prior to; and POST—after.

Circled portions 402-408 in FIG. 4 show that the ARC layers (e.g., ARC layer 106 in FIG. 1) can contribute in a substantial manner to the changes in the bow. For example, after the deposition of layer ARC(2), the bow changed from about 20 μm to about 7 μm. Similarly, after the deposition of layer ARC(3), the bow changed from about +10 μm to about −7 μm. These results are unexpected because it is generally believed in the fabrication art that an ARC layer cannot and does not substantially affect the wafer warpage due to its relatively small thickness (e.g., 0.035 μm) compared to that of the dielectric and conducting layers (e.g., 0.8 and 0.6 μm, respectively). A consequence of this general belief has been that, in method 200 implemented in accordance with conventional prior-art techniques, each and every implementation of step 210 in FIG. 2 for different interconnect levels employs substantially identical process conditions (e.g., temperature, pressure, radio-frequency (RF) power, and gas composition/flow rates). While it is clear from FIG. 4 that these process conditions might be beneficial at some interconnect levels (see, e.g. circled areas 402 and 404) because they reduce the absolute bow value, the very same conditions might in fact become detrimental at some other interconnect levels (see, e.g. circled areas 406 and 408) because they increase the absolute bow value.

Based on the above-established fact that an ARC layer can and does substantially contribute to the wafer warpage, e.g., as illustrated in FIG. 4, an improvement to method 200 is proposed herein. More specifically, in one embodiment of method 200, at least two fabrication steps analogous to step 210 and corresponding to at least two different levels of the multilevel interconnect structure employ different sets of process conditions. These sets of conditions may be selected such that the final wafer warpage is significantly reduced compared to that achieved with the prior-art implementation of method 200. In addition or alternatively, these conditions may be selected such that a relatively flat wafer is obtained at any intermediate fabrication step, e.g., at steps analogous to steps 214 and/or 216 in FIG. 2.

Appropriate process condition can be selected, for example, based on the teachings of a paper by F. H. P. M. Habraken and A. E. T. Kuiper, "Silicon Nitride and Oxynitride Films," Mater. Sci. Eng. R12, No. 3, pp. 123-175 (1994), the teachings of which are incorporated herein by reference. More specifically, this paper describes formation of silicon oxynitride ARC layers (films) using plasma-enhanced chemical vapor deposition (PECVD), which utilizes silane as the silicon source, ammonia and/or nitrogen as the nitrogen sources, and nitrous oxide and/or oxygen as the oxygen source. Depending on the gas flows and other process conditions, the entire range of compositions from silicon nitride ($SiN_y$) to silicon oxide ($SiO_x$) can be achieved with the PECVD process. Furthermore, a paper by S. P. Speakman, et al, "Characterization of PECVD Deposited Silicon Oxynitride Thin Films," Vacuum, v. 38, No. 3, pp. 183-188 (1988), the teachings of which are also incorporated herein by reference, shows that the intrinsic stress in a silicon oxynitride film can be controlled by appropriately controlling, e.g., the Si/N ratio in the film material.

In general, the intrinsic stress in an oxynitride film can be controlled relatively well by an appropriate adjustment of the deposition temperature and/or gas content. The deposition temperature is thought to control the intrinsic stress through two major mechanisms. First, a change in the deposition temperature can change the intrinsic stress via a change in the relative amount of contraction/expansion in the silicon oxynitride layer and the underlying conducting layer when the temperature of the interconnect structure is changed from the deposition temperature to the ambient temperature. Second, a change in the deposition temperature can change the intrinsic stress via a change in the composition of the deposited silicon oxynitride layer and the corresponding change in the relative lattice mismatch between the silicon oxynitride layer and the underlying conducting layer. In contrast, a change in the gas content is thought to control the intrinsic stress primarily through the second mechanism.

Table 1 shows representative process conditions, which can be employed in fabrication steps analogous to step 210 according to one embodiment of the present invention. More specifically, set A is used at interconnect levels 1-3 for the fabrication of layers ARC(1) through ARC(3), while set B is used at interconnect levels 4-8 for the fabrication of layers ARC(4) through ARC(8). IC 100 fabricated using sets A and B has a final bow value of about 10 μm. In contrast, IC 100 fabricated using only set A at each interconnect level for the fabrication of layers ARC(1) through ARC(8) has a final bow value of about 40 μm.

TABLE 1

ARC Layer Fabrication Conditions

| | Set A | Set B |
|---|---|---|
| Temperature (C.) | 410 ± 20 | 410 ± 20 |
| Pressure (Torr) | 6 ± 1.5 | 6 ± 1.5 |
| Gas mixture of $(SiH_4):(N_2O):(NH_3):(He)$ for Si/N ratio of | 0.7 ± 0.1 | 1.2 ± 0.1 |
| RF power (W) | 130 ± 13 | 130 ± 13 |

In alternative embodiments, three or more different sets of fabrication conditions may be employed in different fabrication steps analogous to step 210. For example, in one embodiment, an individual set of fabrication conditions is used for the fabrication of each individual ARC layer, e.g., to maintain the absolute bow value below a certain threshold value after the completion of each fabrication step analogous to step 210. In another embodiment, two or more different sets of process conditions are used for the fabrication of the ARC layers to achieve a specified bow value when a particular selected interconnect level has been fabricated.

Figure 5:
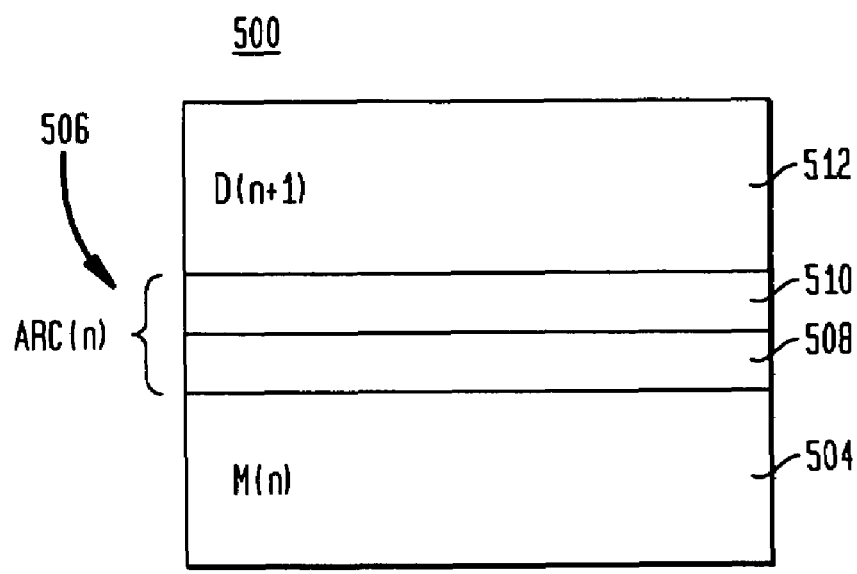
FIG. 5 shows a cross-sectional view of a portion of an IC having a multilevel interconnect structure according to one embodiment of the invention.

FIG. 5 shows a cross-sectional view of a portion of an IC 500 having a multilevel interconnect structure according to one embodiment of the invention. More specifically, FIG. 5 shows a portion of the interconnect structure having a dielectric layer 512, a conducting layer 504, and an ARC layer 506. While layers 504 and 512 of IC 500 are similar to layers 104 and 112, respectively, of IC 100 of FIG. 1, ARC layer 506 is somewhat different from ARC layer 106. In particular, ARC layer 506 includes two ARC sub-layers 508 and 510 having different internal stresses. Employing ARC sub-layers 508 and 510 within ARC layer 506 might enable more precise control of the bow during the fabrication process. The stress difference in ARC sub-layers 508 and 510 can be achieved, e.g., as already explained above, by changing the process conditions. If it is determined during the deposition process of ARC layer 506 that maintaining the existing process conditions throughout the entire deposition duration will produce an unacceptable bow value, then the process conditions can be adjusted to correct the expected deviation. As a result, the deposition process yields two ARC sub-layers 508 and 510 having different intrinsic stresses.

Figure 6:
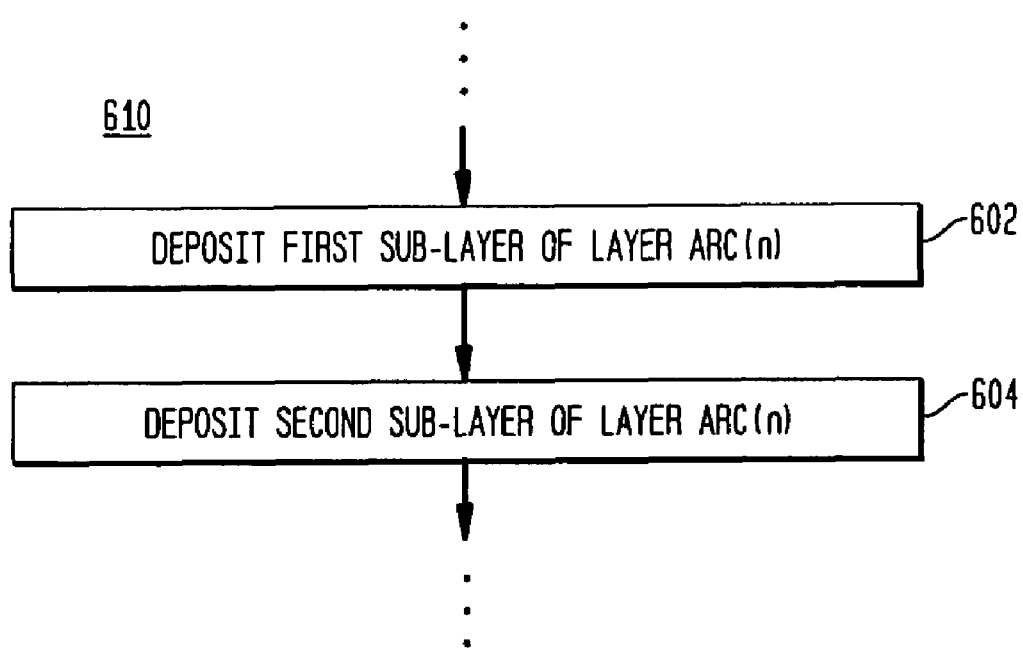
FIG. 6 shows a flow diagram of a representative fabrication process, which can be used to form an ARC layer in the IC of FIG. 5 according to one embodiment of the invention.

FIG. 6 shows a flow diagram of a representative fabrication process 610, which can be used to form ARC layer 506 of IC 500 according to one embodiment of the invention. More specifically, process 610 can be used in method 200 of FIG. 2 as a substitute for step 210. At step 602 of process 610, ARC sub-layer 508 is deposited over conducting layer 504 using a first set of process conditions. At step 604, ARC sub-layer 510 is deposited over ARC sub-layer 508 using a second set of process conditions different from the first set. As explained above, the second set of process conditions is selected such that the wafer meets the bow specifications, e.g., for the execution of subsequent steps 212-214 (FIG. 2). In a representative embodiment, steps 604 and 606 employ different temperatures and/or gas compositions/flow rates. As a result, ARC sub-layers 508 and 510 have different compositions (e.g., Si:N ratios) and/or different lattice mismatch with the lattice of conducting layer 504.

While this invention has been described with reference to illustrative embodiments, this description is not intended to be construed in a limiting sense. For example, an ARC layer can be fabricated to have (i) more than two sub-layers or (ii) a continuous stress/composition gradient, rather than multiple distinct sub-layers, e.g., as shown in FIG. 5. An embodiment having said continuous stress/composition gradient in an ARC layer can be considered as having an infinite number of ARC sub-layers. In general, embodiments of the present invention can have one or more service layers, each of which can have one or more service sub-layers. For example, ARC layer 106 (FIG. 1) can be considered as having a single ARC sub-layer. In another example, an ARC layer similar to ARC layer 506 (FIG. 5) can have multiple ARC sub-layers. Although certain embodiments of the invention have been described using an ARC layer as an example of a service layer and silicon oxynitride as an exemplary material, other service layers and/or materials (e.g., silicon nitride and spin-on silicon rich oxide) can similarly be used without departing from the scope and principles of the invention. An integrated circuit of the invention may have additional layers and/or structures formed on top of the topmost level of the interconnect structure. Integrated circuits of the invention can be incorporated in various products, e.g., consumer electronics. Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. A method of fabricating an integrated circuit, comprising forming on a wafer an interconnect structure having more than one interconnect levels, wherein forming each interconnect level comprises forming a dielectric layer, forming a conducting layer over said dielectric layer, and forming a service layer over said conducting layer, wherein:

each service layer has one or more sub-layers and comprises silicon oxynitride;

at least two of said sub-layers in the interconnect structure have at least one of different compositions and different lattice mismatches with the corresponding one or more conducting layers;

the at least one of the different compositions and the different lattice mismatches with the corresponding one or more conducting layers result in different intrinsic stresses in the at least two sub-layers;

the at least two sub-layers belong to service layers corresponding to different interconnect levels;

for each interconnect level, the method comprises the steps of:

(a) depositing the dielectric layer over the wafer;
(b) depositing the conducting layer over the dielectric layer;
(c) depositing the service layer over the conducting layer;
(d) depositing a photo-resist layer over the service layer;
(e) exposing the photo-resist layer to irradiation through a lithographic mask to imprint a desired pattern;
(f) removing portions of the photo-resist layer to develop the imprinted pattern;
(g) removing portions of the conducting and service layers to transfer the developed pattern onto said conducting and service layers; and
(h) removing remaining portions of the photo-resist layer;

for each instance of step (e), the respective service layer serves as an anti-reflective coating; and the method further comprises:

selecting a bow value; and forming the interconnect structure such that the different intrinsic stresses in the at least two sub-layers cause bow of the wafer to be below said selected bow value.

2. The invention of claim 1, wherein, for at least one interconnect level, step (c) comprises:

(c1) depositing a first service sub-layer over the conducting layer; and (c2) depositing a second service sub-layer over the first service sub-layer, wherein steps (c1) and (c2) have different deposition conditions.

3. The invention of claim 2, wherein the different deposition conditions comprise different deposition temperatures.

4. The invention of claim 2, wherein the different deposition conditions comprise different gas compositions, from which the first and second service sub-layers are formed.

5. The invention of claim 2, wherein step (c2) comprises:

determining bow of the wafer; and adjusting the deposition conditions based on the determined bow.

6. The invention of claim 1, wherein at least two service layers are formed using different deposition temperatures.

7. The invention of claim 1, wherein at least two service layers are formed using different gas compositions, from which said service layers are formed.

8. A product made using the method of claim 1.

9. The invention of claim 1, wherein, upon fabrication of each of the more than one interconnect levels, the wafer is substantially flat.

10. The invention of claim 1, wherein the at least two of said sub-layers in the interconnect structure have different compositions.

11. The invention of claim 1, wherein the at least two of said sub-layers in the interconnect structure have different lattice mismatches with the corresponding one or more conducting layers.

* * * * *